United States Patent
Afghahi

(10) Patent No.: US 6,809,945 B2
(45) Date of Patent: Oct. 26, 2004

(54) CONTENT ADDRESSABLE MEMORY MATCH LINE SENSING TECHNIQUES

(75) Inventor: Morteza Cyrus Afghahi, Mission Viejo, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/389,495

(22) Filed: Mar. 14, 2003

(65) Prior Publication Data

US 2003/0174565 A1 Sep. 18, 2003

Related U.S. Application Data

(63) Continuation-in-part of application No. 10/002,907, filed on Nov. 15, 2001, now abandoned.

(51) Int. Cl.[7] .............................................. G11C 15/00
(52) U.S. Cl. ...................... 365/49; 365/189.07; 365/207
(58) Field of Search ............................... 365/49, 189.07, 365/189.06, 189.11, 205, 207; 711/108, 118

(56) References Cited

U.S. PATENT DOCUMENTS

| | | | |
|---|---|---|---|
| 5,483,479 A | | 1/1996 | Osawa et al. ................. 365/49 |
| 5,598,115 A | * | 1/1997 | Holst ........................... 326/119 |
| 5,642,114 A | * | 6/1997 | Komoto et al. ............... 341/67 |
| 5,905,668 A | * | 5/1999 | Takahashi et al. ............ 365/49 |
| 6,061,262 A | | 5/2000 | Schultz et al. ................ 365/49 |
| 6,091,655 A | | 7/2000 | Yamada et al. ............. 365/210 |
| 6,128,207 A | * | 10/2000 | Lien et al. .................... 365/49 |
| 6,147,891 A | * | 11/2000 | Nataraj ........................ 365/49 |
| 6,191,970 B1 | * | 2/2001 | Pereira ......................... 365/49 |
| 6,195,277 B1 | * | 2/2001 | Sywyk et al. ................. 365/49 |
| 6,307,798 B1 | | 10/2001 | Ahmed et al. .............. 365/207 |
| 6,496,395 B2 | * | 12/2002 | Tokunaga et al. ............ 363/97 |
| 6,552,920 B2 | * | 4/2003 | Chadwick et al. ........... 365/49 |

FOREIGN PATENT DOCUMENTS

JP          07 282586          10/1995

* cited by examiner

*Primary Examiner*—Gene N. Auduong
(74) *Attorney, Agent, or Firm*—McAndrews, Held & Malloy, Ltd.

(57) ABSTRACT

A content addressable memory (10) comprising a group of content addressable cells (20) and a group of corresponding match switches (30) coupled by a first match line (36) that is switched to a first voltage in the event all of the match switches in the group are in a first state and is switched to a second range of voltages in the event one or more of the match switches in the group are in a second state. Apparatus for detecting the state of the first match line comprises a second line (56), a second transistor (58) coupled to the second line, a third transistor (66) coupled in series with the second transistor and a differential amplifier (70) arranged to detect the difference in voltage between the first match line and the second line.

22 Claims, 2 Drawing Sheets

CONTENT ADDRESSABLE MEMORY MATCH LINE SENSING TECHNIQUES

CROSS REFERENCE TO RELATED APPLICATION

This is a continuation in part of U.S. application Ser. No. 10/002,907, filed Nov. 15, 2001 now abandoned.

BACKGROUND OF THE INVENTION

This invention relates to memory cells and more particularly relates to content addressable memory cells.

Many memory devices store and retrieve data by addressing specific memory locations. As a result, this path often becomes the limiting factor for systems that rely on fast memory access. The time required to find an item stored in memory can be reduced considerably if the stored data item can be identified for access by the content of the data itself rather than by its address. Memory that is accessed in this way is called content-addressable memory (CAM). CAM provides a performance advantage over other memory search algorithms (such as binary and tree-based searches or look-aside tag buffers) by comparing the desired information against the stored data simultaneously, often resulting in an order-of-magnitude reduction of search time.

A CAM typically has two sets of sense amplifiers, amplifiers for read data sensing and for match line signal sensing. Referring to FIG. 1, a CAM 10 includes a row 20 of CAM cells, including CAM cells 22–24.

Each of cells 22–24 is connected through bit lines, such as lines 38–39, to a read sense circuit, such as circuit 26. Circuit 26 comprises a differential amplifier that receives input from lines 38–39.

Cells 22–24 are connected to a group 30 of corresponding match switches 32–34 that are connected to a match line 36 and connected to a source of reference potential 35. Each of match switches 32–34 is switchable to a first state in the event of a match between data stored in a corresponding cell and test data introduced on bit lines and is switchable to a second state in the event of a mismatch between data in the corresponding cell and the test data on the bit lines.

Match line 36 is coupled to a match sense circuit 40. Rather than using a differential amplifier as found in read sense circuit 26, a conventional match sense circuit employs an asymmetric circuit, such as transistors 41–42, which are not identical. Another transistor 43 is connected between transistors 41–42 and ground potential as shown. A supply voltage is used as a reference voltage applied to terminal 44. In order to sense the voltage state of line 36, the circuit senses the asymmetric ratio of the reference voltage and the voltage on line 36. The differential sensed margin must remain relatively high for variations of power supply, temperature, wafer process variation, and the influences of skew lots. This requirement reduces the margin of accuracy for the circuit, reduces the speed at which the voltage state of line 36 can be sensed, and requires laborious and increased design time for each different technology used to implement the CAM. This invention addresses these problem and provides a solution.

U.S. Pat. No. 5,598,115 (Holst, issued Jan. 28, 1997) describes in FIG. 17 a second match line 192' connected to transistors 196' and 197. The circuit shown in Holst has disadvantages that are overcome by using the embodiments described in this application. For example, the ability of sense amplifier 190 to sense the differential voltage on lines 192 and 192' is dependent on the elapsed time period after precharge of those lines. After a sufficient time period, both lines 192 and 192' discharge to 0 volts, thereby preventing sense amplifier 190 from sensing a differential voltage. More specifically, transistor 197 may discharge the second match line 192' to 0 volts even if one or more of transistors 196 discharge line 192, thereby preventing sense amplifier 190 from determining whether the voltages on lines 192 and 192' represent a match or a mismatch. A lengthening of the time period may occur during the process of testing the circuit shown in FIG. 17. For example, if the circuit shown in FIG. 17 is normally clocked a 100 MHz, it may be clocked during testing at a lower rate, such as 10 MHz. At the 10 MHz rate, both lines 192 and 192' may discharge to 0 volts, thereby preventing sense amplifier 190 from sensing a differential voltage. The same problem can occur if the FIG. 17 circuit is clocked at various rates for different applications, or if the circuit is used with only a limited number of columns of CAM cells, such as less than 10. The embodiments described in this specification address the problems presented by the Hoist circuitry and provide a solution.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

One apparatus embodiment of the invention is useful in a content addressable memory comprising a group of content addressable cells and a group of corresponding match switches coupled by a first match line. Each match switch is switchable to a first state in the event of a match between data stored in a corresponding cell and test data and is switchable to a second state in the event of a mismatch between data in the corresponding cell and the test data. The first match line is switched to a first voltage in the event all of the match switches in the group are in the first state and is switched to a second range of voltages in the event one or more of the match switches in the group are in the second state. In such an environment, the state of the first match line is detected by apparatus comprising a second line and a second switch outside the group of corresponding match switches coupled to the second line. A third switch outside the group of corresponding match switches is coupled in series with the second switch. A differential amplifier is coupled to the first match line and the second line and is arranged to detect the difference in voltage between the first match line and the second line.

One method embodiment of the invention is useful in a content addressable memory comprising a group of content addressable cells and a group of corresponding match switches coupled by a first match line and coupled to a source of reference potential. Each match switch is switchable to a first state in the event of a match between data stored in a corresponding cell and test data and is switchable to a second state in the event of a mismatch between data in the corresponding cell and the test data. The first match line is switched to a first voltage in the event all of the match switches in the group are in the first state and is switched to a second range of voltages in the event one or more of the match switches in the group are in the second state. In such an environment, the state of the first match line is detected by a method comprising placing a second line in the environment of the first match line and limiting the voltage on the second line to a predetermined range of voltages relative to the reference potential. The difference in voltage between the first match line and the second line is detected.

By using the foregoing techniques, the state of a match line can be detected with a degree of accuracy and reliability previous unattained.

These and other advantages and novel features of the present invention, as well as details of an illustrated embodiment thereof, will be more fully understood from the following description and drawings.

DETAILED DESCRIPTION OF THE INVENTION

Figure 1:
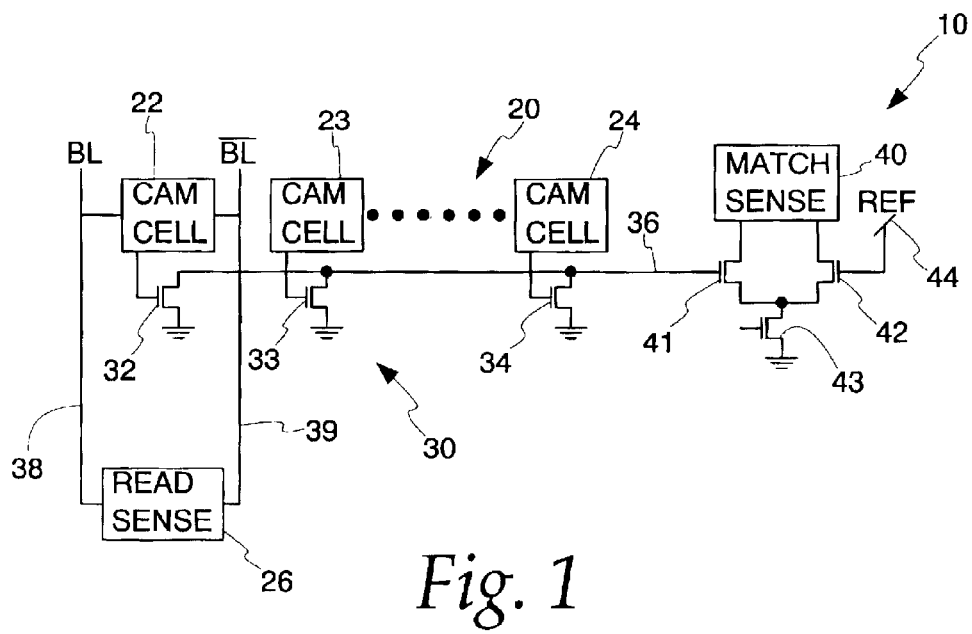
FIG. 1 is a schematic diagram of a prior art match line detection circuit in an exemplary content addressable cell.
Figure 2:
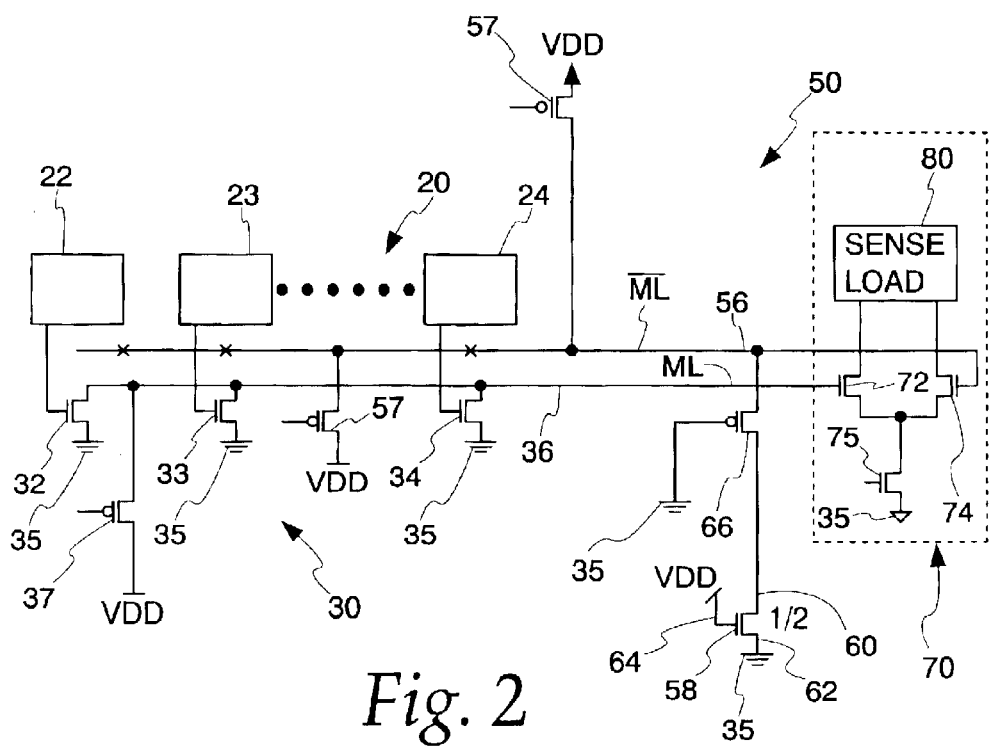
FIG. 2 is a schematic diagram of a first form of content addressable cell made in accordance with the invention.

Referring to FIG. 2, one form of CAM 50 made in accordance with the invention includes the same type of CAM cells 22–24, match switches 32–34 and match line 36 shown in FIG. 1. More specifically, match switches 32 and 34 comprise n-channel transistors having a narrow range of physical sizes. In practice, transistors 32 and 34 are made as identical as possible in size.

Another line 56 is located in the same environment as line 36 and has the same loading as line 36. More specifically, the diffusion loading on both lines 36 and 56 is substantially identical. P-channel transistors 37 and 57 are used to precharge lines 36 and 56, respectively, to a supply voltage VDD. Precharge transistor 57 is identical to precharge transistor 37.

Line 56 also is connected to a first type of transistor comprising a p-channel transistor 66 and is connected in series to a second type of transistor comprising an n-channel transistor 58 connected as shown.

Transistor 58 has a drain 60 connected to line 56, a source 62 connected to ground potential and a gate 64 connected to a supply voltage VDD. Transistor 58 is reduced in size and driving strength compared to the driving strength of switches 32–34, and in practice, transistor 58 has one half the driving strength of switches 32–34. Line 56 provides a differential signal for line 36. By using transistors 32–34 and 58, line 56 is driven with one half the strength of line 36.

Due to the connection to supply voltage VDD, transistor 58 is turned on and drives line 56, for example, about 100 millivolts below VDD. When each of transistors 32–34 is turned off, line 36 already is precharged to a voltage near VDD and above the voltage of line 56. When one of transistors 32–34 is turned on, the voltage of line 36 is driven down below the voltage of line 56. When additional transistors in group 30 (e.g., transistors 32–34) are turned on, the voltage of line 36 is driven further below the voltage present when only one of transistors 32–34 is turned on. Depending on the number of transistors 32–34 turned on, a range of voltages below the voltage on line 56 is provided. For all of the foregoing conditions, the voltage on line 56 provides a reliable differential signal for the voltage on line 36.

A differential sense amplifier 70 detects the difference in voltage between line 36 and line 56. In FIG. 2, the differential input transistors are 72 and 74. The gates of transistors 72 and 74 are connected to lines 36 and 56, respectively. Another transistor 75 is connected to ground potential as shown.

A sense load 80 is connected to transistors 72 and 74 as shown.

Line 56 does not discharge to 0 volts, even if line 56 is sensed by sense amplifier 70 long after the precharge of line 56. Thus, line 56 is limited to a predetermined range of voltages relative to reference potential 35, such as voltages greater than 0 volts. Even if only one of transistors 32–34 discharges line 36 to 0 volts, sense amplifier 70 will detect a mismatch, because line 56 does not discharge to 0 volts. Line 56 will discharge to Vtp, where Vtp is the threshold voltage of p-channel transistor 66.

The foregoing arrangement offers advantages compared to the circuitry shown in Holst. For example, the FIG. 2 arrangement saves power because line 56 never discharges all the way to 0 volts. In addition, sense amplifier 70 can detect a match or mismatch irrespective of the rate at which the circuit shown in FIG. 2 is clocked, irrespective of the number of columns of CAM cells connected to line 36. The gate of transistor 66 is connected to a reference potential VSS or ground potential 35, but the gate of transistor 66 can be connected to any voltage between VDD and ground potential or to any voltage between VDD and potential VSS to save power.

Figure 3:
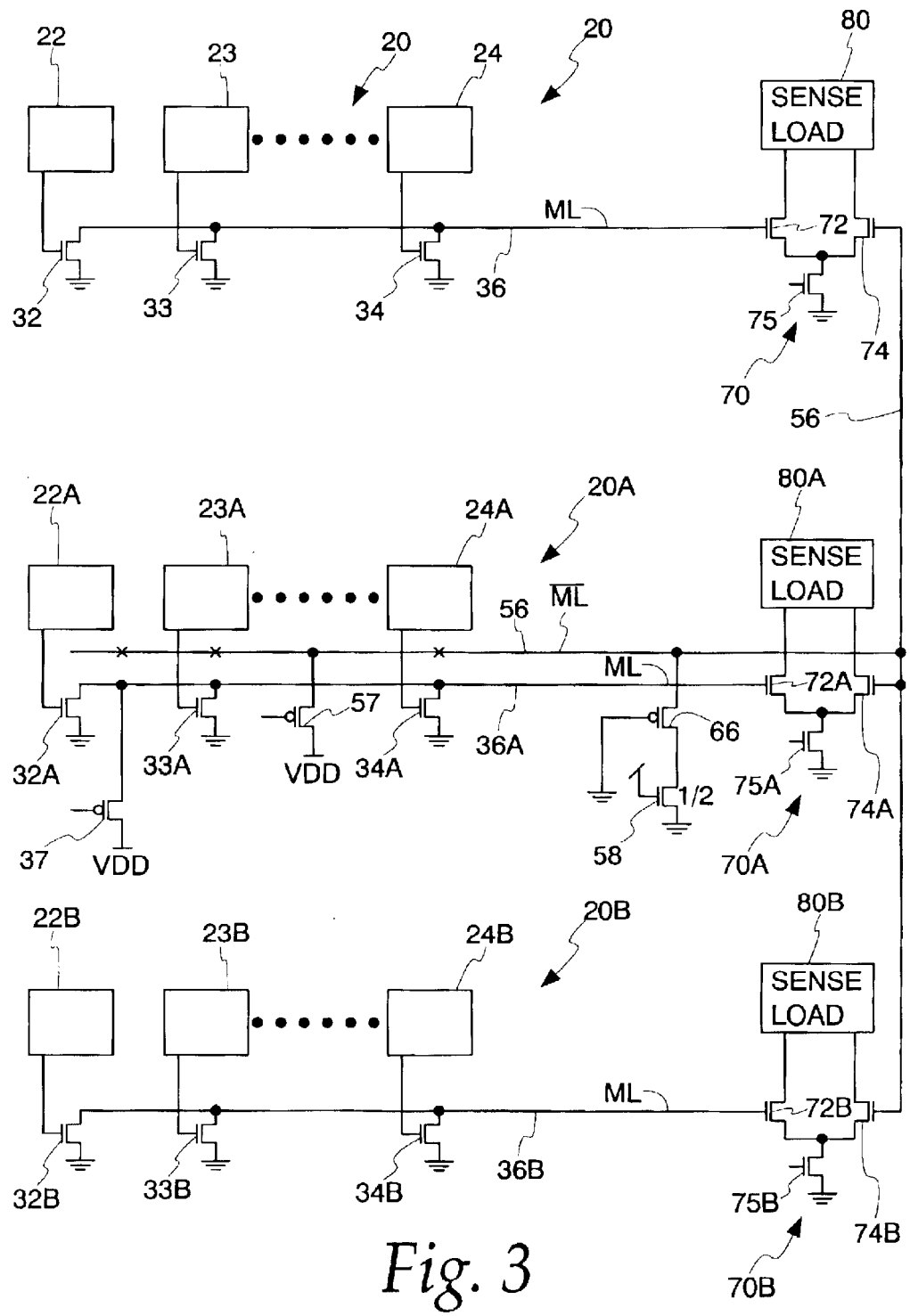
FIG. 3 is a schematic diagram of a second form of the cell shown in FIG. 2.

Referring to FIG. 3, a single line 56 can provide a reference signal for several rows of CAM cells. More specifically, cell row 20 is identical to the cell row shown in FIG. 2. A cell row 20A comprises CAM cells 22A–24A and corresponding match switches 32A–34A connected as shown to a match line 36A. A cell row 20B comprises CAM cells 22B–24B and corresponding match switches 32B–34B connected as shown to a match line 36B. Differential amplifiers 70, 70A and 70B comprising transistor pairs 72 and 74, 72A and 74A, and 72B and 74B and additional transistors 75, 75A and 75B are connected as shown. Line 56 is connected to the gates of each of transistors 74, 74A and 74B as shown. Sense loads 80, 80A and 80B are connected as shown.

While the invention has been described with reference to one or more preferred embodiments, those skilled in the art will understand that changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. In a content addressable memory comprising a group of content addressable cells and a group of corresponding match switches coupled by a first match sense line, each match switch being switchable to a first state in the event of a match between data stored in a corresponding cell and test data and being switchable to a second state in the event of a mismatch between data in the corresponding cell and the test data, the first sense match line being switched to a first voltage in the event all of the match switches in the group are in the first state and being switched to a second range of voltages in the event one or more of the match switches in the group are in the second state, apparatus for detecting the state of the first match sense line comprising:

a second match sense line different from the first match sense line;

a second switch outside the group of corresponding match switches coupled to the second match sense line;

a third switch outside the group of corresponding match switches coupled in series with the second switch; and a differential amplifier coupled to the first match sense line and the second match sense line arranged to detect the difference in voltage between the first match sense line and the second match sense line.

2. The apparatus of claim 1 wherein the second switch is arranged to place a third voltage on the second match sense line, the third voltage being different from the first voltage and the second range of voltages.

3. The apparatus of claim 1 wherein the match switches in the group comprise a predetermined first size range and wherein the second switch comprises a second predetermined size less than the first predetermined size range.

4. The apparatus of claim 1 wherein the match switches in the group have a first driving strength and wherein the second switch has a second driving strength less than the first driving strength.

5. The apparatus of claim 4 wherein the second driving strength is one half the first driving strength.

6. The apparatus of claim 1 wherein the match switches comprise transistors.

7. The apparatus of claim 1 wherein the second switch comprises a transistor of a first type and where the third switch comprises a transistor of a second type different from the first type.

8. The apparatus of claim 2 wherein the third voltage ties between the first voltage and the second range of voltages.

9. The apparatus of claim 1 and further comprising a sense amplifier coupled to the differential amplifier.

10. The apparatus of claim 1 and further comprising:
a second group of content addressable cells and a second group of corresponding match switches coupled by a third match sense line, each match switch in the second group being switchable to a first state in the event of a match between data stored in a corresponding cell and test data and being switchable to a second state in the event of a mismatch between data in the corresponding cell and the test data, the third match sense line being switched to the first voltage in the event all of the match switches in the second group are in the first state and being switched to the second range of voltages in the event one or more of the match switches in the second group are in the second state; and
a second differential amplifier coupled to the third match sense line and the second match sense line being arranged to detect the difference in voltage between the third match sense line and the second match sense line.

11. The apparatus of claim 1 wherein the second switch is coupled to a supply voltage and a reference voltage and wherein the third switch is coupled to a voltage between the supply voltage and the reference potential.

12. The apparatus of claim 11 wherein the third switch comprises a transistor with a gate and wherein the gate is coupled to the voltage between the supply voltage and the reference potential.

13. The apparatus of claim 1 wherein the second match sense line has the same loading as the first match sense line.

14. The apparatus of claim 1 wherein the second match sense line is subject to the same environment as the first match sense line.

15. In a content addressable memory comprising a group of content addressable cells and a group of corresponding match switches coupled by a first match sense line and coupled to a source of reference potential, each match switch being switchable to a first state in the event of a match between data stored in a corresponding cell and test data and being switchable to a second state in the event of a mismatch between data in the corresponding cell and the test data, the first match sense line being switched to a first voltage in the event all of the match switches in the group are in the first state and being switched to a second range of voltages in the event one or more of the match switches in the group are in the second state, a method of detecting the state of the first match sense line comprising:
placing a second match sense line in the environment of the first match sense line
limiting the voltage on the second match sense line to a predetermined range of voltages relative to the reference potential;
detecting the difference in voltage between the first match sense line and the second match sense line.

16. The method of claim 15 and further comprising placing a third voltage on the second match sense line, the third voltage being different from the first voltage and the second range of voltages.

17. The method of claim 16 wherein the third voltage lies between the first voltage and the second range of voltages.

18. The method of claim 15 wherein the content addressable memory further comprises a second group of content addressable cells and a second group of corresponding match switches coupled by a third match sense line, each match switch in the second group being switchable to a first state in the event of a match between data stored in a corresponding cell and test data and being switchable to a second state in the event of a mismatch between data in the corresponding cell and the test data, the third match sense line being switched to the first voltage in the event all of the match switches in the second group are in the first state and being switched to the second range of voltages in the event one or more of the match switches in the second group are in the second state and wherein the method further comprises detecting the difference in voltage between the third match sense line and the second match sense line.

19. The method of claim 15 and further comprising loading the second match sense line substantially the same as the first match sense line.

20. The method of claim 15 and further comprising subjecting the second match sense line to substantially the same environment as the first match sense line.

21. The method of claim 15 and further comprising:
driving the first match sense line with a first driving strength; and
driving the second match sense line with a second driving strength less than the first driving strength.

22. The method of claim 21 wherein the second driving strength is one half the first driving strength.

* * * * *